(12) United States Patent
Van Empel et al.

(10) Patent No.: US 9,766,558 B2
(45) Date of Patent: Sep. 19, 2017

(54) LITHOGRAPHIC APPARATUS WITH FLEXIBLE TRANSPORTATION LINE HAVING VARYING STIFFNESS BETWEEN TWO OBJECTS

(75) Inventors: Tjarko Adriaan Rudolf Van Empel, Eindhoven (NL); Martijn Houkes, Sittard (NL); Norbert Erwin Therenzo Jansen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1477 days.

(21) Appl. No.: 12/710,752

(22) Filed: Feb. 23, 2010

(65) Prior Publication Data
US 2010/0238424 A1    Sep. 23, 2010

Related U.S. Application Data

(60) Provisional application No. 61/161,594, filed on Mar. 19, 2009.

(51) Int. Cl.
*G03B 27/52* (2006.01)
*G03F 7/20* (2006.01)

(52) U.S. Cl.
CPC .......... *G03F 7/709* (2013.01); *G03F 7/70725* (2013.01)

(58) Field of Classification Search
CPC .............................. G03F 7/70725; G03F 7/709

USPC ........................ 355/72, 73–76, 53
See application file for complete search history.

(56) References Cited

U.S. PATENT DOCUMENTS 6,879,377 B2    4/2005    Jacobs et al.

FOREIGN PATENT DOCUMENTS

| CN | 1450410 | 10/2003 |
|----|---------|---------|
| JP | 2003-203862 | 7/2003 |
| JP | 2005-051197 | 2/2005 |

OTHER PUBLICATIONS

Japanese Office Action dated Jan. 10, 2012 in corresponding Japanese Patent Application No. 2010-060381.
Chinese Office Action dated Dec. 25, 2012 in corresponding Chinese Patent Application No. 201010143315.3.

*Primary Examiner* — Chia-How Michael Liu
(74) *Attorney, Agent, or Firm* — Pillsbury Winthrop Shaw Pittman LLP

(57) ABSTRACT

A positioning apparatus includes a first object and a second object; a positioning system configured to position the first and the second objects with respect to each other; and a flexible transportation line that is connected to the first and the second objects, the flexible transportation line having a stiffness that varies along the flexible transportation line such that the flexible transportation line can be represented by a dynamic transfer function, the dynamic transfer function being adapted to a closed-loop transfer function of the positioning system.

15 Claims, 9 Drawing Sheets

LITHOGRAPHIC APPARATUS WITH FLEXIBLE TRANSPORTATION LINE HAVING VARYING STIFFNESS BETWEEN TWO OBJECTS

CROSS REFERENCE TO RELATED APPLICATIONS

This application claims priority and benefit under 35 U.S.C. §119(e) to U.S. Provisional Patent Application No. 61/161,594, entitled "Lithographic Apparatus and Device Manufacturing Method", filed on Mar. 19, 2009. The content of that application is incorporated herein in its entirety by reference.

FIELD

The invention relates to a positioning apparatus provided with a first object and a second object and to a lithographic apparatus including such a positioning apparatus.

BACKGROUND

Positioning apparatus, including a first object and a second object, are known in lithographic apparatuses wherein the first object is part of a long stroke module and the second object is part of a short stroke module. The concept of the cooperation of the combination of a long stroke and a short stroke concept is a well known machine layout for a lithographic apparatus. Hereby, the long stroke module is responsible for a movement over a long stroke with a limited accuracy and the short stroke module object is able to move over a smaller stroke with a higher position accuracy. The short stroke module is then connected with the long stroke module via a flexible transportation line for transportation of for example electricity, fluids, vacuum applications, et cetera. A specific example is that the short stroke is provided with water via the flexible transportation line.

In the known positioning apparatus, the stiffness, damping and mass properties of the flexible transportation line act as a static and dynamic disturbance force between the first object and the second object. If the mass of the flexible transportation line is connected with a too low stiffness, a low natural frequency of the flexible transportation line may cause undesired disturbance forces due to the free moving mass of the flexible transportation line. Increasing the natural frequency of the flexible transportation line by increasing the stiffness of the flexible transportation line raises the direct coupling between the objects. The dynamic disturbance effects may result in position errors of the first object and the second object. Accordingly and as a consequence, these position errors may result in undesired imaging problems and/or overlay errors of the lithographic apparatus.

SUMMARY

An aspect of the invention is to reduce the dynamic disturbances of the flexible transportation line. Accordingly, one embodiment of the invention is based on the insight that it is desirable to obtain a sophisticated balance between, on the one hand, a flexible transportation line with a relatively low mutual stiffness and, on the other hand, a high internal stiffness of the flexible transportation line to prevent relatively low frequent dynamic behavior of the flexible transportation line. Accordingly, in one embodiment of the invention, a flexible transportation line is provided with a stiffness as function of the position at the flexible transportation line achieving a dynamic transfer function of the flexible transportation line which is adapted to a closed-loop transfer function of the positioning system.

The effect of adapting the flexible transportation line according to an embodiment of the invention is that a balance can be obtained between mutual stiffness requirements, on the one hand, and the dynamic behavior of the flexible transportation line, on the other hand, based on knowledge of a close-loop transfer function of the positioning system.

In a preferred embodiment, the flexible transportation line is provided with a stiffness as function of the position at the flexible transportation line such that the flexible transportation line (FTL) has a first hinge (HNG1). Such an embodiment has the beneficial effect that a relatively low mutual stiffness is created between the first and the second object.

In a further embodiment, the flexible transportation line may further include a substantially straight and dimensionally stable first part and a substantially straight and dimensionally stable second part wherein the first part and the second part are connected via the first hinge such that the parts can pivot with respect to each other around the hinge. Such an embodiment has the beneficial effect that the high internal stiffness of the flexible transportation line prevents relatively low frequent dynamic behavior of the flexible transportation line.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
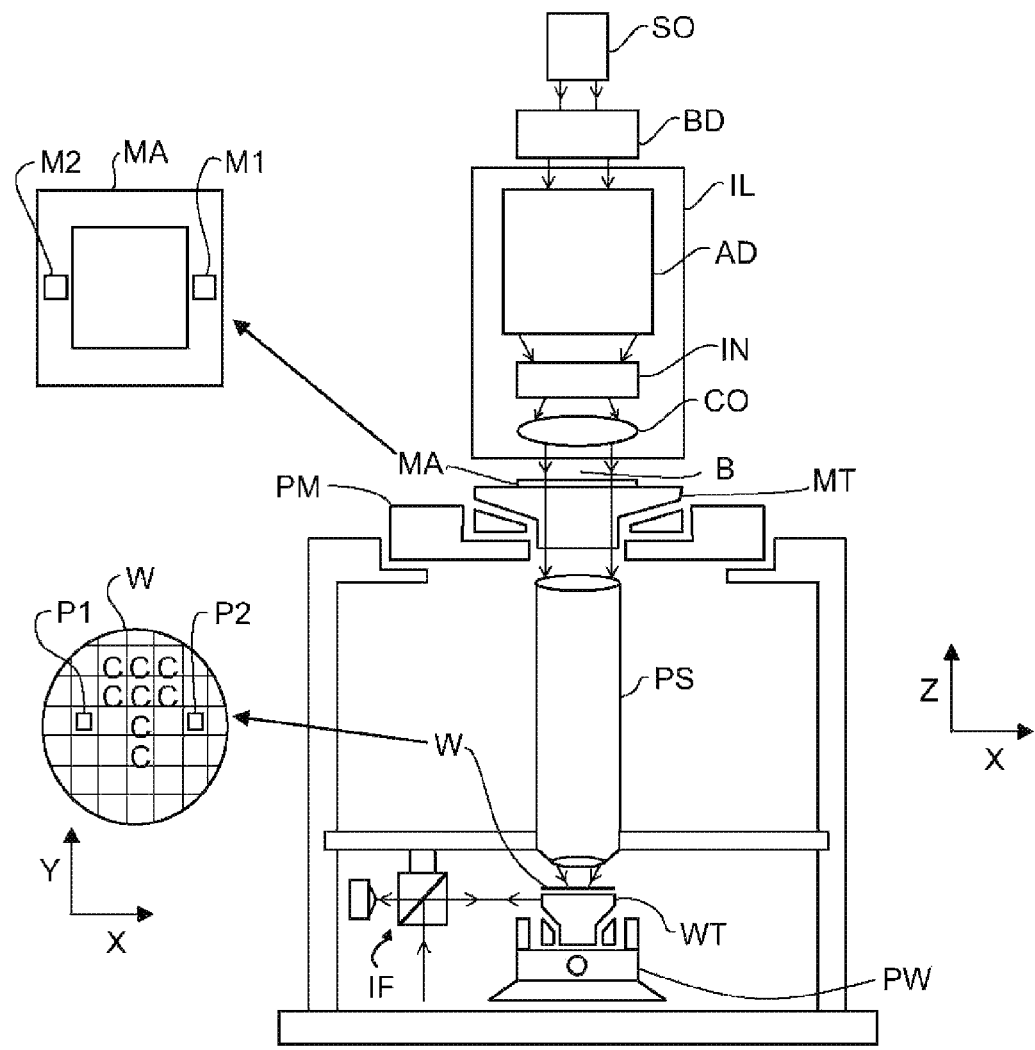
FIG. 1 schematically depicts a lithographic apparatus according to one embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
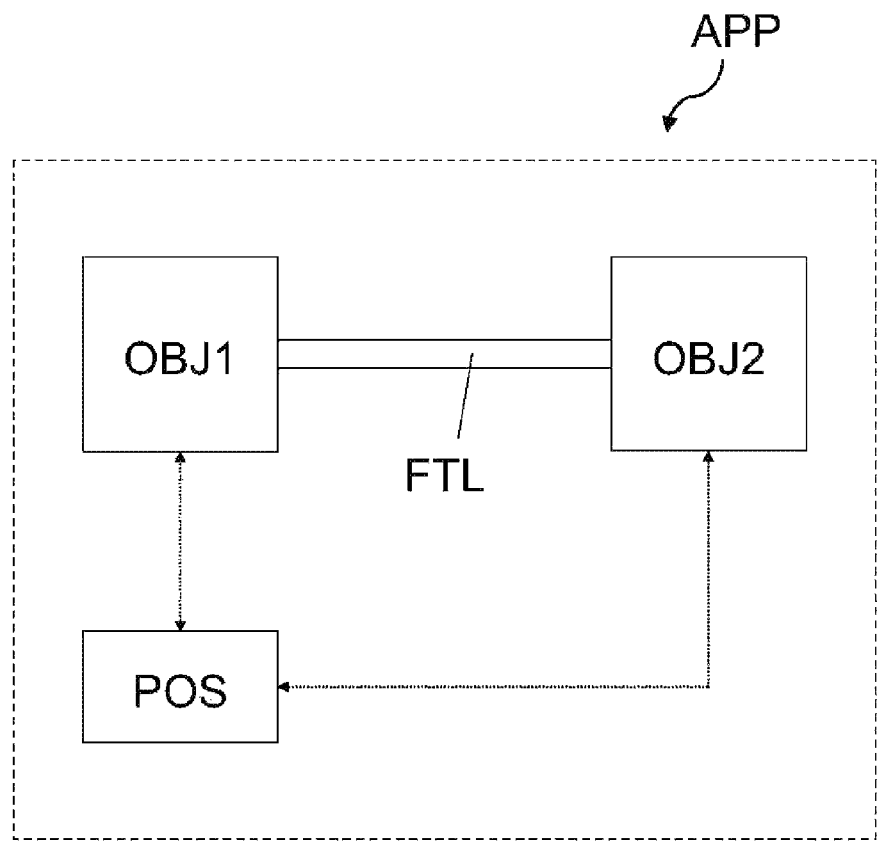
FIG. 2 shows a top view of a positioning apparatus provided with a first object and a second object which is further provided with a flexible transportation line.

FIG. 2 shows a top view of the positioning apparatus (APP) provided with a first object (OBJ1) and a second object (OBJ2). The positioning apparatus (APP) can be used to position objects in the lithographic apparatus. The positioning apparatus (APP) is provided with a positioning system (POS) configured to position the second object (OBJ2) with respect to the first object (OBJ1) and is further provided with a flexible transportation line (FTL) which connects the objects. The flexible transportation line (FTL) is, for example, constructed and arranged to transport a medium or the flexible transportation line (FTL) is, for example, a wire provided to transport electricity between the first object (OBJ1) and the second object (OBJ2), or a wire to transport optical information, but there may also be a flexible transportation line (FTL) to transport a medium and/or a flexible transportation line (FTL) to transport electricity. In an embodiment of the invention, the positioning apparatus consists of a two stage concept wherein the first object (OBJ1) corresponds to a long stroke module that is responsible for a movement over a long stroke with a limited accuracy and the second object (OBJ2) corresponds to a short stroke module object that is able to move over a smaller stroke with a higher position accuracy. In an embodiment, a first part of the flexible transportation line that is attached to the movable part of the long stroke module is orientated substantially parallel to a first direction of movement of the movable part. In an embodiment, the first direction of movement is a scan direction.

Figure 3:
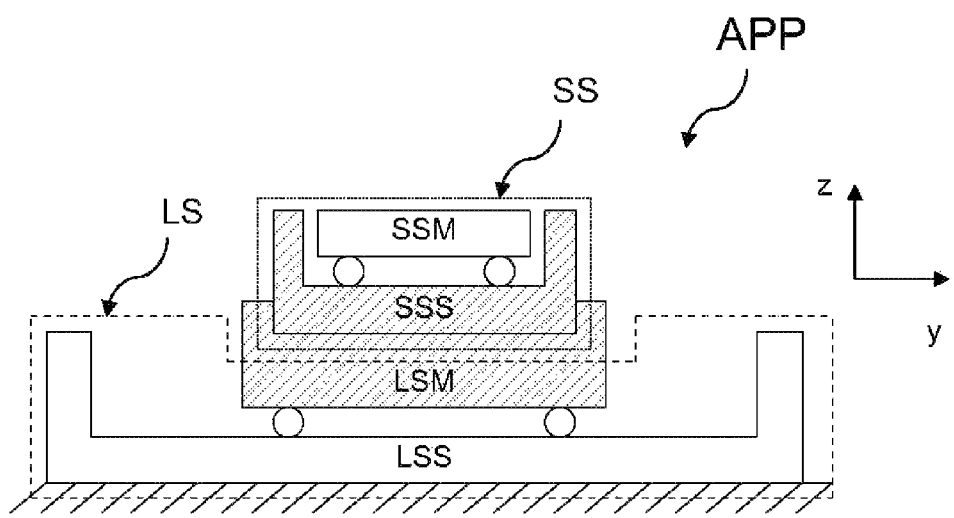
FIG. 3 schematically shows a position apparatus including a long stroke module and a short stroke module in accordance with one embodiment of the invention.

FIG. 3 shows a schematic representation of such an embodiment of the invention wherein the position apparatus (APP) consists of a long stroke module (LS) and a short stroke module (SS). Each module can be divided into a stationary and a moveable part, wherein each module includes a motor (not shown) to move the moveable part of the module relative to the stationary part. The moveable part of the long stroke module (LSM) is moveable relative to the stationary part of the long stroke module (LSS) in at least one direction. The moveable part of the short stroke module (SSM) is moveable relative to the stationary part of the short stroke module (SSS) in at least one direction. The stationary part of the short stroke module (SSS) is attached to the movable part of the long stroke module (LSM). In this embodiment of the invention, the first object (OBJ1) consists of the movable part of the long stroke module (LSM) including the stationary part of the short stroke module (SSS) (indicated as the hatched part in FIG. 3) and the second object (OBJ2) corresponds to the movable part of the short stroke module (SSM).

Figure 4:
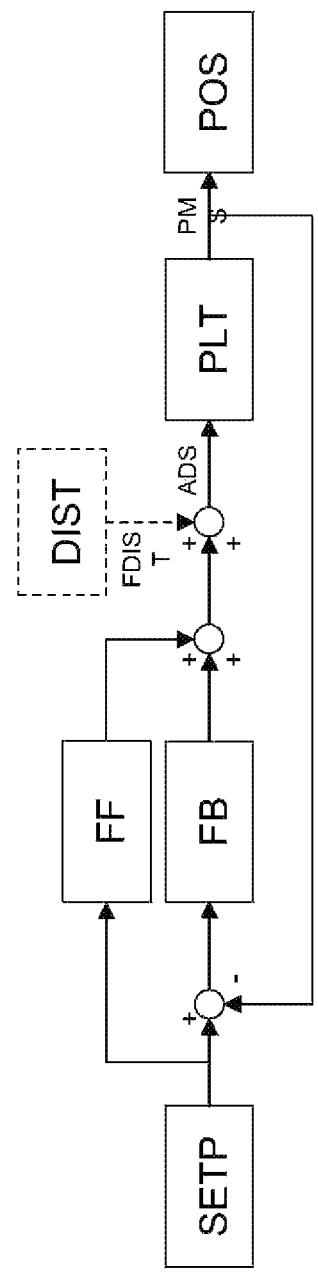
FIG. 4 shows a standard control diagram in which a controller set-point is injected into a combined feed-forward and feedback control system.

FIG. 4 depicts a standard control diagram in which a controller set-point (SETP) is injected into a combined feedforward (FF) and feedback (FB) control system. A feedback control loop is formed by the controller (FB) and the physical plant (PLT). The physical plant (PLT) represents a transfer function from an actuator drive signal (ADS) of the stage to a position measurement signal (PMS) as provided by any suitable measurement system. Besides actuator forces acting on the physical plant (PLT) due to the controller set-point (SETP), the actual position of the physical plant (PLT) may also be influenced by an external disturbance source (DIST) causing an external disturbance force (FDIST) which effect are corrected by the feedback control loop. Because there is no a-priori knowledge of the disturbance force (FDIST) some delay might be caused by the feedback loop. As a consequence such kind of disturbance inherently affects the position accuracy of the physical plant (PLT). The sensitivity of the position measurement signal (PMS) due to such external disturbance force (FDIST) can be expressed in a transfer function which is known in the art as the process sensitivity transfer function (HPS). This frequency dependent transfer function can be expressed as indicated in Equation (1).

$$HPS(\omega) = \frac{PMS(\omega)}{FDIST(\omega)} = \frac{PLT(\omega)}{1 + FB(\omega) \cdot PLT(\omega)} \qquad (1)$$

Figure 5:
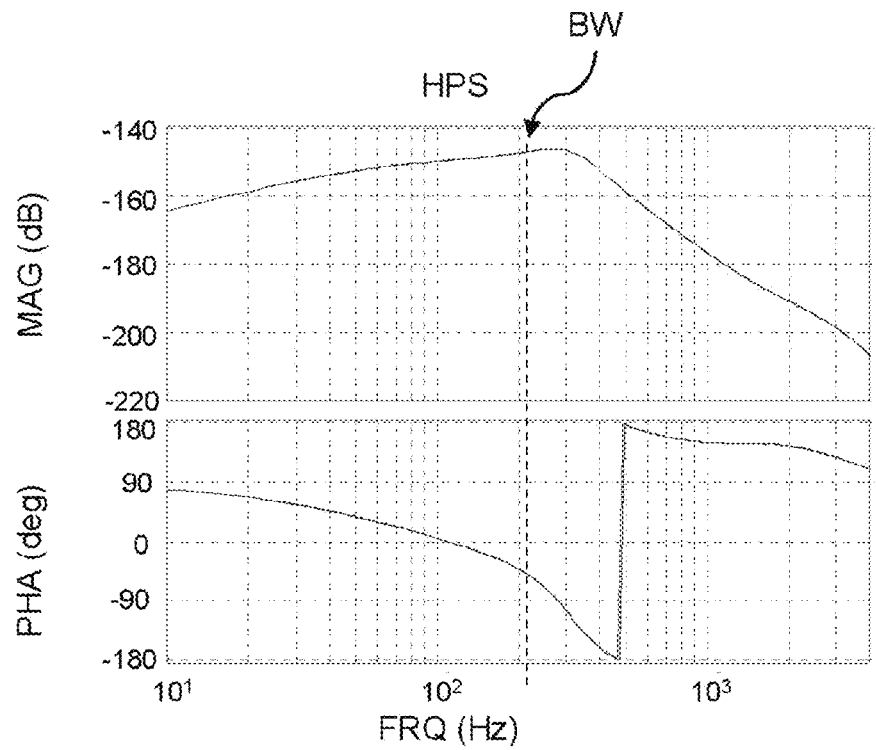
FIG. 5 shows an example of process sensitivity transfer function from a free moving mass controlled by a PID-controller and a specified controller bandwidth.

FIG. 5 shows an example of a bode diagram of a typical process sensitivity transfer function (HPS) from a free moving mass of 20 [kg] controlled by a PID-controller with a selected bandwidth (BW) of approximately 300 [Hz]. The upper part of the diagram shows the magnitude (MAG) of the transfer function in decibel (dB) of the process sensitivity as function of the frequency (FRQ) in Hertz (Hz) and the lower part of the diagram shows the phase (PHA) of the transfer function in degrees (Deg) of the process sensitivity as function of the frequency (FRQ). Below the bandwidth (BW) the feedback controller (FB) is able to suppress the effects of the disturbance force (DIST) to a certain extent especially because, in this example, an integral action is included in the feedback-controller. If no integral action was included in the feedback controller (FB) the process sensitivity would substantially be inversely proportional to the proportional gain of the feedback controller (FB) up to the bandwidth of the feedback controller (FB). Above the bandwidth the feedback controller (FB) is no longer able to influence the transfer function of the process sensitivity (HPS) and the well known −2 slope of a free moving mass becomes visible above the bandwidth (BW) as indicated in FIG. 5. From this transfer function it may be concluded that the position measurement signal (POS) is less sensitive for a high frequent disturbance force (DIST) compared with a low frequent disturbance force. Stated more generally, the effect of an external disturbance force (FDIST) on the position measurement signal (PMS) depends on the frequency and the amplitude of the external disturbance force (FDIST). Some examples, of such disturbance forces and the accompanying requirements for the flexible transportation line (FTL) may be described as:

The pressure drop of a medium transported between the objects (OBJ1) and (OBJ2) should be low for example to allow sufficient transport and to minimize flow noise. Therefore, it is preferable to use a flexible transportation line (FTL) with a large diameter. Increasing the diameter while using the same wall thickness results however in an increased mass of the flexible transportation line (FTL).

The free vibrating mass attached to the objects (OBJ1) and (OBJ2) should preferably be small and high frequent regarding servo errors. Therefore, it is desirable to use a flexible transportation line (FTL) with a low mass and a high stiffness.

The stiffness between the objects (OBJ1) and (OBJ2) should be low for example to decrease distortions of the objects. Therefore, it is desirable to use a flexible transportation line (FTL) with a low stiffness.

For specific applications (for example high-vacuum) the material of the flexible transportation line (FTL) should preferably be high purity, non-outgassing, low diffusion. Therefore, it is desirable to use a flexible transportation line (FTL) from an inherent stiff material.

In an embodiment according to the invention, wherein the positioning apparatus consists of a two stage concept and the first object (OBJ1) corresponds with a long stroke module (LS) that is responsible for a movement over a long stroke with a limited accuracy and the second object (OBJ2) corresponds with a short stroke module (SS) that is able to move over a smaller stroke with a higher position accuracy, the flexible transportation line forms a direct connection between the modules. Due to the stiffness of the flexible transportation line (FTL), relative movement between the long stroke module (LS) and the short stroke module (SS) results in a certain deformation of the flexible transportation line (FTL) causing a disturbance force on the modules. For low frequent disturbance forces, the force substantially corresponds with the static stiffness of the flexible transportation line (FTL) multiplied with the mutual displacement between the modules.

Figure 6:
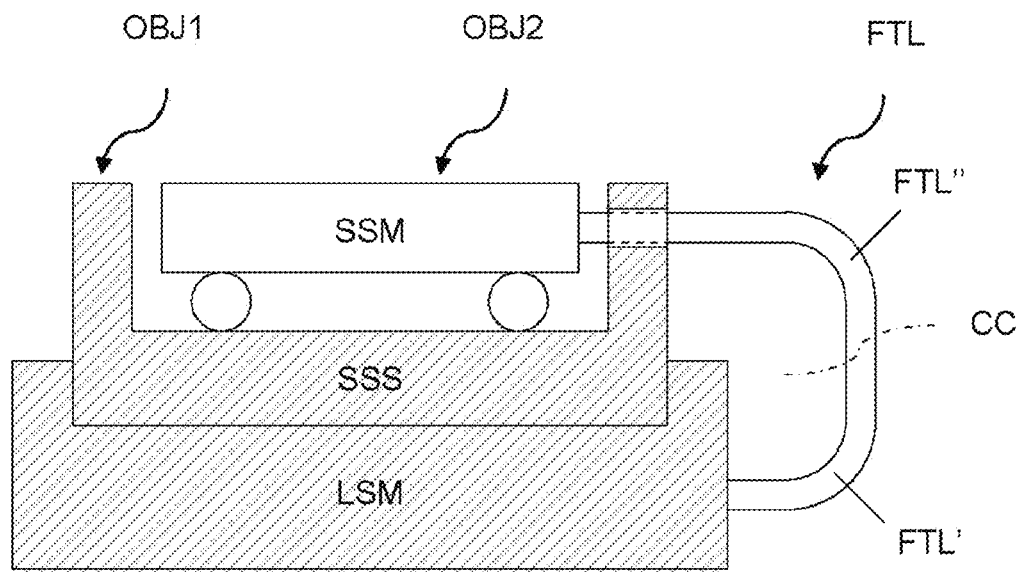
FIG. 6 schematically shows a zoomed schematic representation of the embodiment as shown in FIG. 3.

FIG. 6 shows a zoomed schematic representation of an embodiment according to the invention, wherein the flexible transportation line (FTL) is connected between the first object (OBJ1) that is shown as the hatched part and which is formed by the movable part of the long stroke (LSM) including the stationary part of the short stroke (SSS) and the second object (OBJ2) corresponding to the movable part of the short stroke (SSM). In FIG. 6, the flexible transportation line (FTL) is virtually divided in a first part of the flexible transportation line (FTL') and a second part of the flexible transportation line (FTL") by the cross-cut (CC). The physical behavior of the first object (OBJ1) and the second object (OBJ2) are influenced by the dynamic behavior of respective the first part (FTL') and the second part (FTL") of the flexible transportation line (FTL) respectively.

Figure 7:
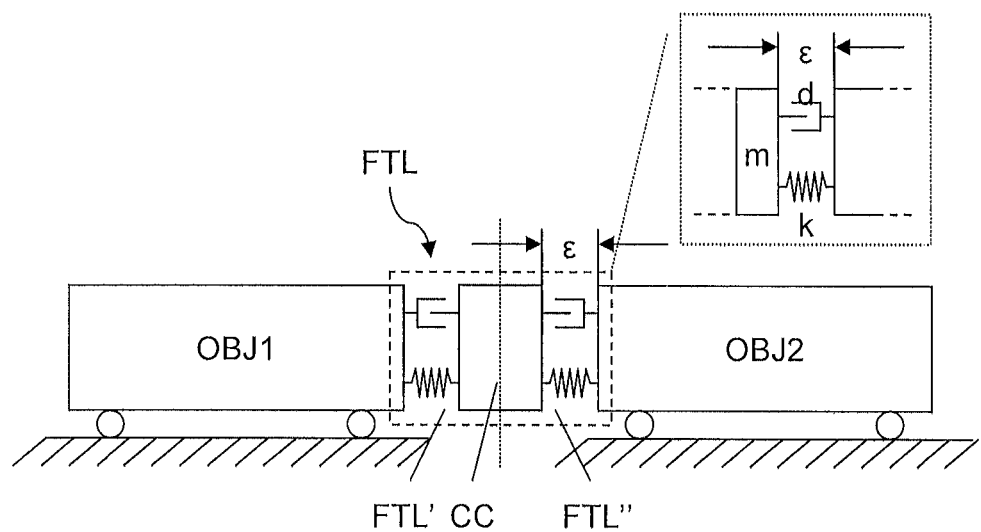
FIG. 7 shows a further schematic representation of FIG. 6.

FIG. 7 shows a schematic representation of the first object (OBJ1) and the second object (OBJ2) including the first part of the flexible transportation line (FTL') and the second part of the flexible transportation line (FTL") separated by the cross-cut (CC). The parts obtain specific dynamic properties like mass, stiffness and damping as indicated by (m), (k) and (d) respectively. There is no active control mechanism or controller configured to control the position of the flexible transportation line (FTL) in such an embodiment. After finishing, for example, an acceleration or deceleration setpoint, the parasitic dynamic system corresponding to the flexible transportation line (FTL) performs a damped vibration until all energy is dissipated. Such damped vibration causes an external disturbance force (FDIST) on both the first object (OBJ1) and the second object (OBJ2) and accordingly influences the dynamic performance of the objects as earlier described in FIG. 4.

As an example, for a substantially static disturbance force on the second object (OBJ2) due to the parasitic dynamics of the second part of the flexible transportation line (FTL") with a stiffness constant (k), such disturbance force can be determined according to Equation (2) wherein the mutual displacement between the second part of the flexible transportation line (FTL") and the second object (OBJ2) is referred to as ϵ.

$$F_{DIST} = k \cdot \epsilon \qquad (2)$$

As an example, in case of a substantially dynamic disturbance force on the second object (OBJ2), the relationship between the mutual displacement between the second part of the flexible transportation line (FTL") and the second object (OBJ2) and the acceleration of the second object (OBJ2) can be calculated according to Equation (3)

$$\varepsilon = \frac{1}{\omega_0^2} \cdot a \cdot e^{-\zeta \cdot \omega_0 \cdot t} \cdot \sin(\omega_0 \cdot t) \qquad (3)$$

Wherein $\omega_0$ refers to the natural frequency of the second part of the flexible transportation line (FTL"), 'a' refers to the acceleration of the second object (OBJ2) and $\xi$ refers to the percentage critical damping of the damper (d). Substitution of Equation (3) into Equation (2) results in an expression for the amplitude and the frequency of the external disturbance force (FDIST) acting on the second object (OBJ2), for example due to an acceleration or deceleration of the second object (OBJ2).

$$F_{DIST} = \frac{k}{\omega_0^2} \cdot a \cdot e^{-\xi \cdot \omega_0 \cdot t} \cdot \sin(\omega_0 \cdot t) \quad (4)$$

As shown in FIG. 4, a feed-forward control signal (FF) may also be applied to the physical system (PLT) for control purposes. As known from the art, a certain mismatch between the required and the actual feed-forward signal (FF) is hardly inevitable and may be caused, for example, by inaccuracies of tuned parameters, non-linearity's of the physical properties and variations in the physical system (PLT). This may result worst-case in a step-response of the physical system (PLT), causing an excitation of the flexible transportation line (FTL) dynamics represented as a mass-spring-damper system according to FIG. 7. The external disturbance force (FDIST) caused by such a mass-spring-damper system is shown in Equation 4.

Applying an arbitrary force on a substantially free moving mass such as the second object (OBJ2) according to the described embodiment, the dynamic transfer function between the displacement of the free moving mass 'm' and the force applied on the free moving mass may be represented according to Equation (5)

$$\left| \frac{x(\omega)}{F(\omega)} \right| = \frac{1}{m \cdot \omega^2} \quad (5)$$

After rearrangement of Equation 5 wherein the frequency of the disturbance force (FDIST) where the disturbance force exists is substituted as $\omega_e$, the frequency dependent displacement 'x' of such a free moving mass may be expressed according to Equation 6.

$$x = \frac{1}{m \cdot \omega_e^2} \cdot F_{DIST} \quad (6)$$

Further substitution of Equation 4 into Equation 6 results in Equation 7 representing the displacement 'x' due to a certain acceleration 'a' applied to a free moving mass such as the second object (OBJ2) according to an embodiment of the invention.

$$x = \frac{k}{m \cdot \omega_e^4} \cdot a \quad (7)$$

From Equation (7) it may be concluded that regarding the cause of the described disturbance forces (FDIST), a small displacement of the second object (OBJ2) preferably requires a combination of a low mutual stiffness, low acceleration and/or deceleration levels, a high mass of the second object (OBJ2) and a high natural frequency of the dynamic system such as a flexible transportation line (FTL). Although Equation (7) is derived for a case wherein the acceleration profile is applied as a step response, which is known in the art as a $2^{nd}$ order set-point profile, even more advanced acceleration set-point profiles like $3^{th}$ or $4^{th}$ order profiles can not solve the contradictive requirements as shown in Equation 7. Current developments tend to lighter stages, increased acceleration and deceleration levels and higher required accuracies causing that the displacement of the second object (OBJ2) increases instead of decreases which is undesirable. With the described analysis, it can be concluded that it is desirable to obtain a sophisticated balance between, on the one hand, a flexible transportation line (FTL) with a relatively low mutual stiffness and, on the other hand, a high internal stiffness of the flexible transportation line to prevent relatively low frequent dynamic behavior of the flexible transportation line (FTL). The flexible transportation line (FTL) is therefore provided with a stiffness as function of the position at the flexible transportation line (FTL) achieving a dynamic transfer function (DTF) of the flexible transportation line (FTL), which is adapted to the closed-loop transfer function of the positioning system (POS). Until now the flexible transportation line (FTL) was represented as a lumped mass single degree of freedom (DOF) dynamic system, but in reality the flexible transportation line (FTL) is a flexible part containing frequency dependent complex mode shapes which may act as parasitic dynamic forces on the objects in each of such DOF's.

Figure 8A:
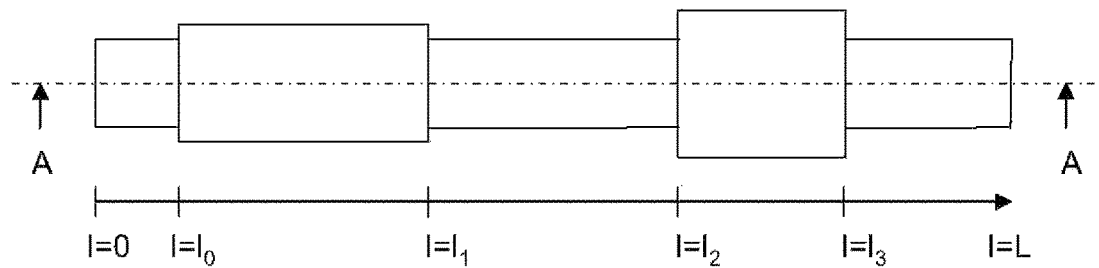
FIGS. 8A-C show an example of a flexible transportation line according to an embodiment of the invention.
Figure 8B:
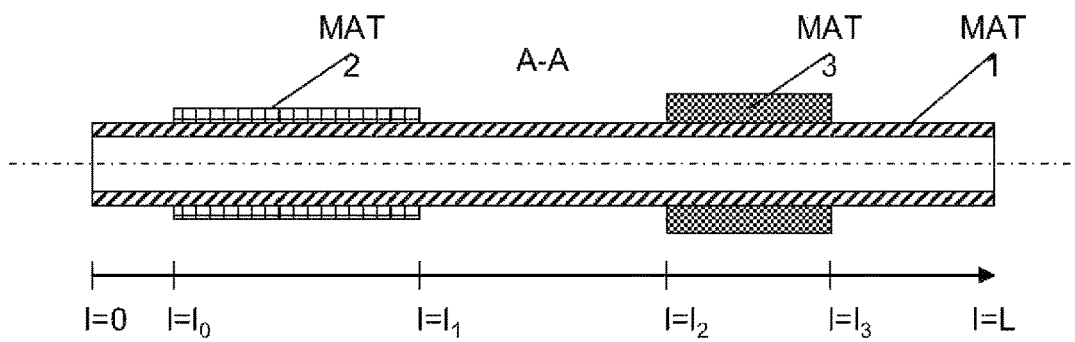
Figure 8C:
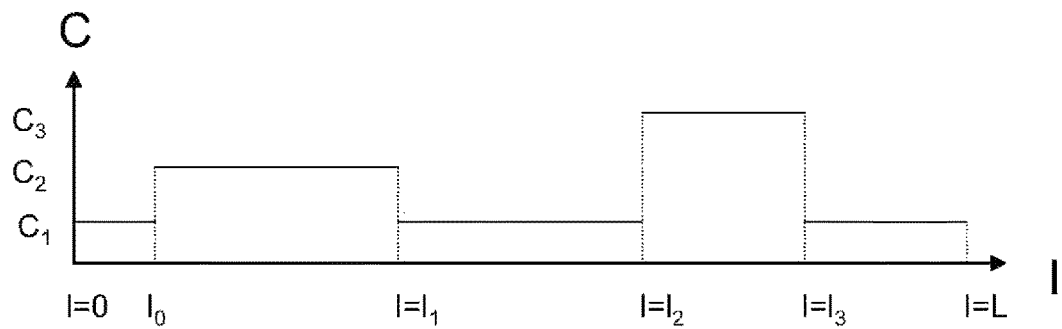

FIG. 8A shows a side-view of a flexible transportation line (FTL) according to an embodiment of the invention and indicates that the flexible transportation line (FTL) may have a substantially irregular outer diameter. FIG. 8B shows a cross-section of the flexible transportation line (FTL) according to the line A-A as shown in FIG. 8A. The cross-section indicates that the flexible transportation line (FTL) may be constructed and arranged with a first material (MAT1) over the complete length of the flexible transportation line (FTL) in the range between [l=0; l=L] and further may be provided with a second material (MAT2) with a certain thickness on top of the base material in the range between [l=$l_0$; l=$l_1$]. As an example the flexible transportation line (FTL) may even be provided with a third material (MAT3) with a certain thickness on top of the base material in the range between [l=$l_2$; l=$l_3$]. FIG. 8C shows an example of the stiffness as function of the position at the flexible transportation line (FTL) wherein the stiffness of the flexible transportation line (FTL) equals $C_1$ in the ranges between [l=0; l=L], [l=$l_1$; l=$l_2$ and [l=$l_3$; l=L] using a first material (MAT1) and wherein the stiffness of the flexible transportation line (FTL) equals $C_2$ and $C_3$ respective in the range between [l=$l_0$; l=$l_1$] and [l=$l_2$; l=$l_3$] using a second material (MAT2) and third material (MAT3) respectively. A person skilled in the art will appreciate that a certain stiffness may also be provided by combining more layers of the same or different materials, but will also appreciate that the first (MAT1), second (MAT2) and third material (MAT3) may also be the same material and that different stiffness can be arranged by varying the material thickness.

Figure 9:
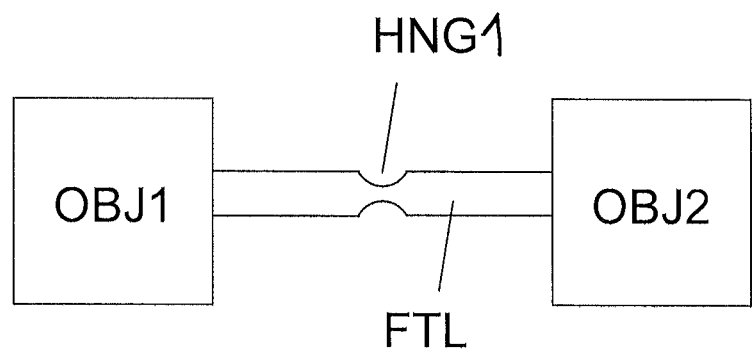
FIG. 9 schematically shows a flexible transportation line coupled to two objects in accordance with one embodiment of the current invention.

FIG. 9 shows a flexible transportation line according to an embodiment of the invention. In FIG. 9, the stiffness as function of the position at the flexible transportation line is such that the flexible transportation line (FTL) has a first hinge (HNG1). In this embodiment, the mutual stiffness between the first object (OBJ1) and the second object (OBJ2) decreases while the dynamic behavior of the flexible transportation line is hardly influenced.

Figure 10:
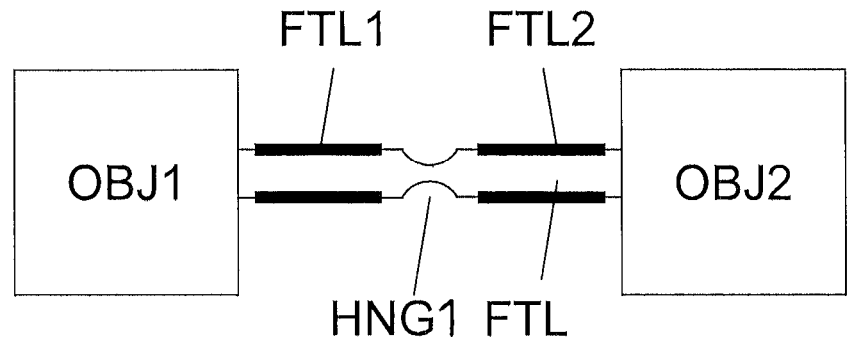
FIG. 10 schematically shows a flexible transportation line coupled to two objects in accordance with another embodiment of the current invention.

FIG. 10 shows a flexible transportation line according to an embodiment of the invention. In FIG. 10, the stiffness as function of the position at the flexible transportation line (FTL) is such that the flexible transportation line (FTL) includes a substantially straight and dimensionally stable first part (FTL1) and a second substantially straight and dimensionally stable part (FTL2) which are connected with the first hinge (HNG1) such that the parts can pivot with respect to each other around the hinge (HNG1). The hinge is preferably free from play and substantially stiff in all directions except around the pivot angle. In such an embodiment the first object (OBJ1) and the second object (OBJ2) are coupled with a low mutual stiffness while the internal stiffness of the first part of the flexible transportation line (FTL1) and the second part of the flexible transportation line (FTL2) are increased. Due to the increased internal stiffness of the first part of the flexible transportation line (FTL1) and the second part of the flexible transportation line (FTL2) the natural frequency of the parts increases, which may result in a better dynamic performance of at least the second object (OBJ2) improving the imaging and the overlay performance.

Figure 11:
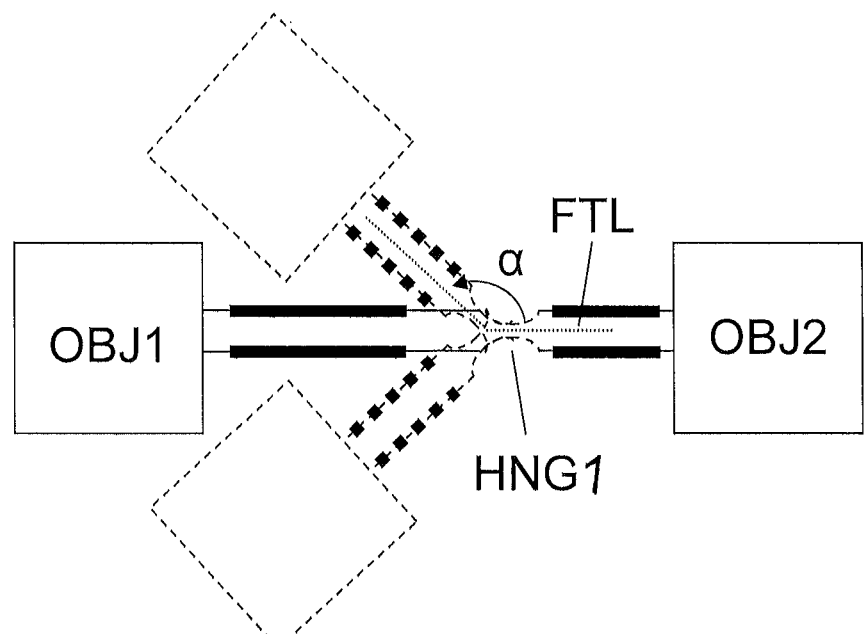
FIG. 11 schematically shows a flexible transportation line coupled to two objects in accordance with another embodiment of the current invention.

FIG. 11 shows yet another embodiment of the invention wherein the first hinge (HNG1) has a pivot angle between the parts, wherein the pivot angle (α) has a range between 0 and 360 degrees. In such an embodiment the first hinge (HNG1) allows the second object (OBJ2) to move with respect to the first object (OBJ1) around the pivot angle (α) with a range as indicated although the first part of flexible transportation line (FTL1) and the second part of flexible transportation line (FTL2) are substantially straight and dimensionally stable.

Figure 12:
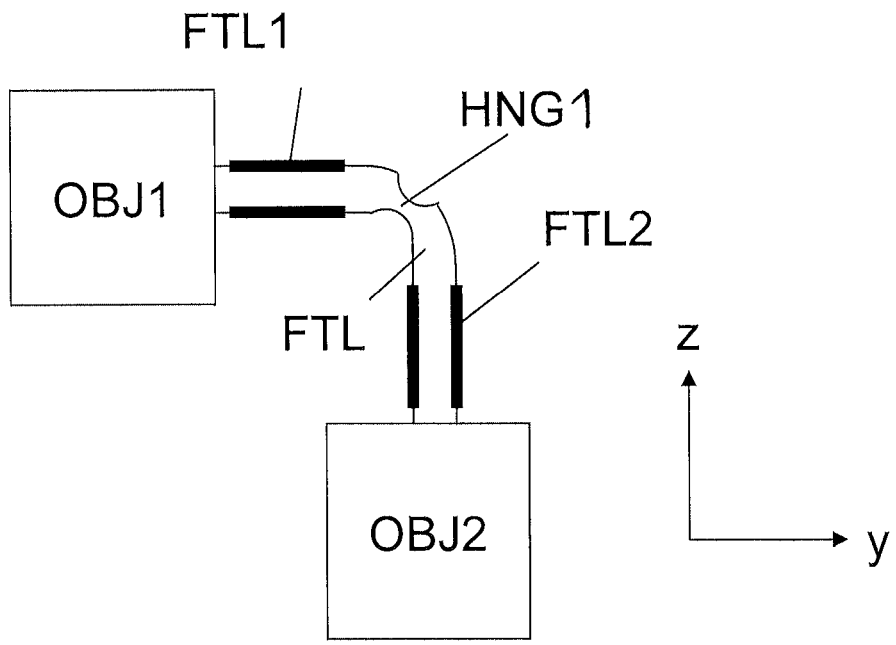
FIG. 12 schematically shows a flexible transportation line coupled to two objects wherein the first hinge has a neutral position whereby the pivot angle equals substantially 90 degrees in accordance with one embodiment of the invention.

FIG. 12 shows an embodiment of the invention wherein the first hinge (HNG1) has a neutral position whereby the pivot angle equals substantially 90 degrees and wherein the flexible transportation line (FTL) is substantially free from internal stress. Such a neutral position may be realized by using a preformed flexible transportation line. As an example, the largest range of motion of the first object (OBJ1) and the second object (OBJ2) may be in the horizontal xy-plane. The embodiment has the benefit that horizontal movement of the first object (OBJ1) causes less disturbance forces (FDIST) through the flexible transportation line (FTL) onto the second object (OBJ2) due to the relatively low mutual stiffness between the objects and on the other hand a high internal stiffness of the flexible transportation line (FTL) preventing relatively low frequent dynamic behavior of the flexible transportation line (FTL).

Figure 13:
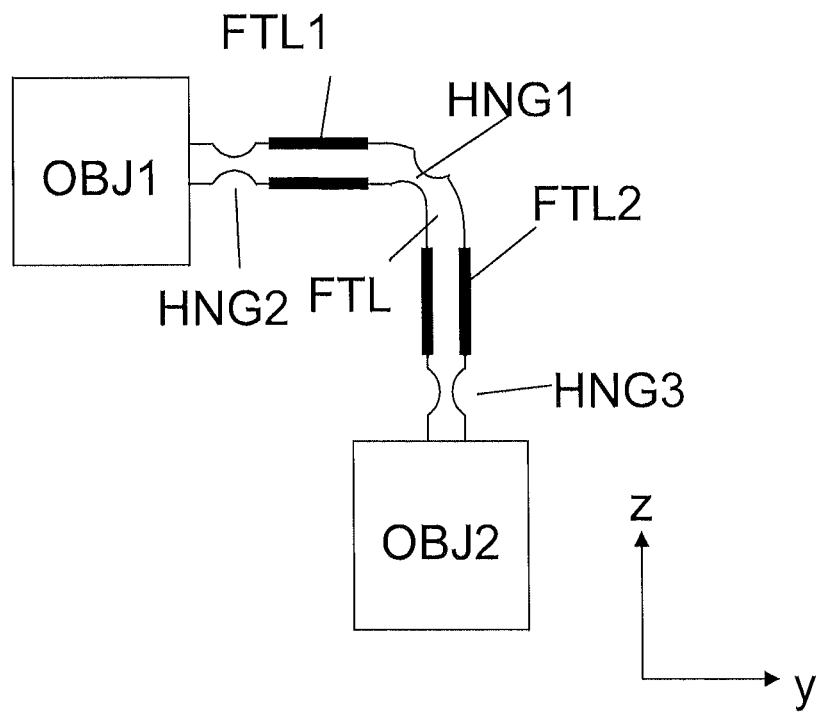
FIG. 13 schematically shows a flexible transportation line coupled to two objects in accordance with another embodiment of the invention.

FIG. 13 shows a further embodiment of the invention wherein the stiffness as function of the position at the flexible transportation line is such that the flexible transportation line (FTL) has respectively a second hinge (HNG2) and a third hinge (HNG3) located nearby respectively the first object (OBJ1) and the second object (OBJ2). A benefit of such an embodiment results in an even further decreased mutual stiffness between the objects whereas the internal stiffness of the of the first part of the flexible transportation line (FTL1) and the second part of the flexible transportation line (FTL2) are kept at substantially the same level. A further embodiment of the flexible transportation line (FTL) may include substantially straight and dimensionally stable parts with a reduced torsion stiffness in the transportation direction. Such a reduced torsion stiffness may be constructed and arranged by cutting notches in the outer diameter of the first part (FTL1) and/or second part (FTL2) of the flexible transportation line (FTL). In such an embodiment even a better balance can be realized between the mutual stiffness and on the other hand a high internal stiffness to prevent relatively low frequent dynamic behavior of the flexible transportation line (FTL).

Figure 14:
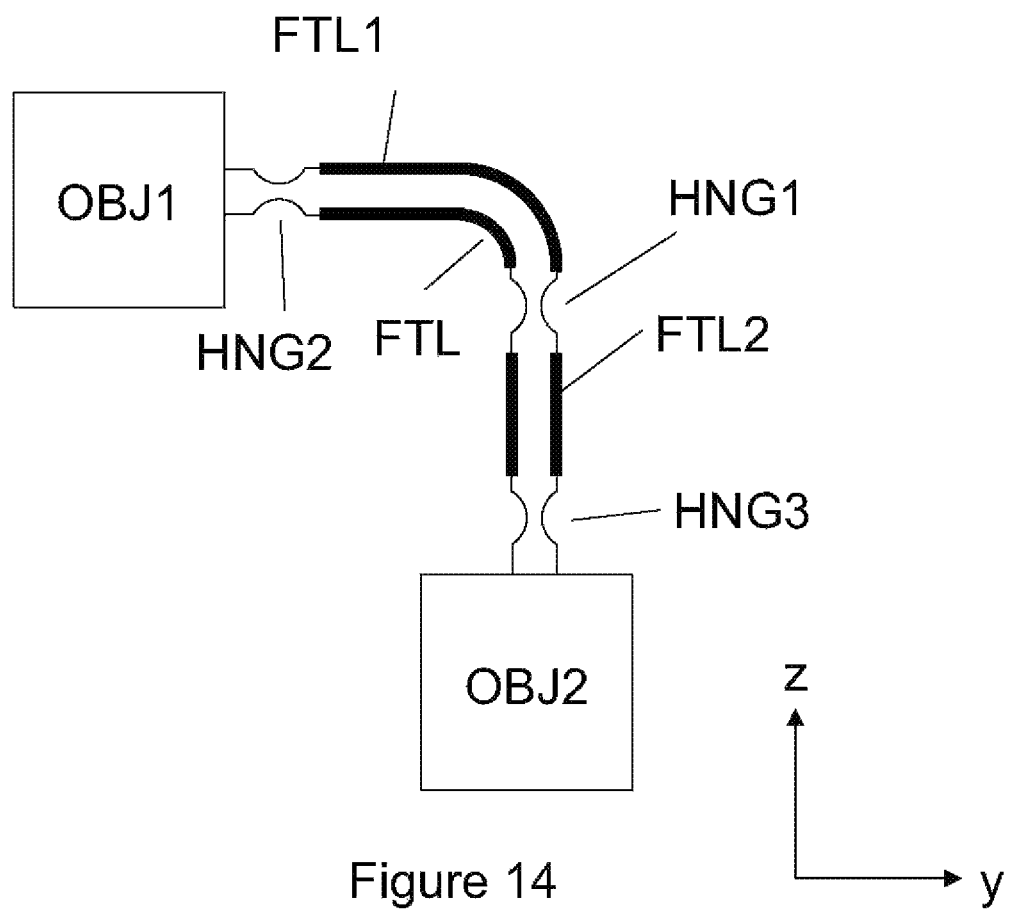
FIG. 14 schematically shows a flexible transportation line coupled to two objects in accordance with one embodiment of the invention.

FIG. 14 shows an embodiment of the invention wherein the first part of the flexible transportation line (FTL1) attached to the first object (OBJ1) is provided with a substantially curved and dimensionally stable part (FTL1) nearby the first hinge (HNG1). This embodiment has a further benefit because more mass of the flexible transportation line (FTL) is attached to the first object (OBJ1) which object has reduced dynamic performance requirements compared with the second object (OBJ2). A further benefit of the substantially curved and dimensionally stable part (FTL1) from this embodiment is a reduced static disturbance force caused by impulse variations when, for example, the transport direction of a cooling medium changes from, for example, a horizontal direction (e.g. y-direction) into, for example, a vertical direction (e.g. z-direction) as the medium flows for example from the first object (OBJ1) to the second object (OBJ2). A disturbance force (FDIST) that needs to be compensated by the physical plant (PLT) results in heat generation in the actuator system, and consequently requires a certain amount of cooling medium to keep the actuator system at a predefined level. Reduced force levels result consequently in less heat generation and accordingly require less cooling medium.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning apparatus comprising:
   a first object and a second object;
   a positioning system configured to position the first and the second objects with respect to each other; and
   a flexible transportation line that is connected to the first and the second objects, the flexible transportation line having a stiffness that varies along the flexible transportation line such that said flexible transportation line can be represented by a dynamic transfer function, said dynamic transfer function being adapted to a closed-loop transfer function of the positioning system,
   wherein the flexible transportation line comprises a first hinge, a substantially straight and dimensionally stable first part and a substantially straight and dimensionally stable second part that each have an end connected to the first hinge, and wherein the first part and the second part are connected via the first hinge such that the first and second parts can pivot with respect to each other and each of the first and second parts have a longitudinal shape that remain unchanged when the first and second parts pivot with respect to each other, and
   wherein, in use, a part of the flexible transportation line forming said first hinge twists during pivot movement between said first part and said second part to enable said pivot movement.

2. The apparatus of claim 1, wherein the first hinge has a pivot angle between the first and second parts, wherein the pivot angle has a range between 0 and 360 degrees.

3. The apparatus of claim 2, wherein the first hinge has a neutral position and the pivot angle equals substantially 90 degrees.

4. The apparatus of claim 1, wherein the flexible transportation line has a second hinge and a third hinge located nearby respectively the first object and the second object.

5. The apparatus of claim 1, wherein a first part of the flexible transportation line attached to the first object is provided with a substantially curved and dimensionally stable part nearby the first hinge.

6. The apparatus of claim 1, wherein the flexible transportation line is a hose constructed and arranged to transport a medium and/or a wire configured to transport electricity or optical information between the first object and the second object of the positioning apparatus.

7. The apparatus of claim 1, wherein the first object is a long stroke module of the positioning apparatus and the second object is a short stroke module of the positioning apparatus.

8. The apparatus of claim 1, wherein the flexible transportation line includes a first material over a complete length thereof and a second material arranged on the first material over a length shorter than the complete length of the flexible transportation line.

9. The apparatus of claim 8, wherein the second material is different than the first material.

10. The apparatus of claim 1, wherein the first hinge is free from play and substantially stiff in all directions except around a pivot angle.

11. The apparatus of claim 1, wherein the first object and the second object are coupled with a low mutual stiffness while an internal stiffness of a first part of the flexible transportation line and a second part of the flexible transportation line are increased.

12. A lithographic apparatus comprising:
    a patterning device support constructed to support a patterning device, the patterning device being capable of imparting a radiation beam with a pattern in a cross-section to form a patterned radiation beam;
    a substrate table constructed to hold a substrate;
    a projection system configured to project the patterned radiation beam onto a target portion of the substrate; and
    a positioning apparatus including
      a first object and a second object;
      a positioning system configured to position the first and the second objects with respect to each other; and
      a flexible transportation line that is connected to the first and the second objects, the flexible transportation line having a stiffness that varies along the flexible transportation line such that said flexible transportation line can be represented by a dynamic transfer function, said dynamic transfer function being adapted to a closed-loop transfer function of the positioning system,
    wherein the first object is a movable part of a long stroke module and the second object is a movable part of a short stroke module,
    wherein the flexible transportation line comprises a first hinge, a substantially straight and dimensionally stable first part and a substantially straight and dimensionally stable second part that each have an end connected to the first hinge, and wherein the first part and the second part are connected via the first hinge such that the first and second parts can pivot with respect to each other and each of the first and second parts have a longitudinal shape that remain unchanged when the first and second parts pivot with respect to each other, and
    wherein, in use, a part of the flexible transportation line forming said first hinge twists during pivot movement between said first part and said second part to enable said pivot movement.

13. The lithographic apparatus of claim 12, wherein the first part of the flexible transportation line that is attached to the movable part of the long stroke module is orientated substantially parallel to a first direction of movement of the movable part.

14. The lithographic apparatus of claim 13, wherein the first direction of movement is a scan direction.

15. A positioning apparatus comprising:
    a first object and a second object;
    a positioning system configured to position the first and the second objects with respect to each other; and
    a flexible transportation line that is connected to the first and the second objects, the flexible transportation line having a stiffness that varies along the flexible transportation line such that said flexible transportation line can be represented by a dynamic transfer function, said dynamic transfer function being adapted to a closed-loop transfer function of the positioning system, wherein the flexible transportation line comprises a first hinge, a substantially straight and dimensionally stable first part and a substantially straight and dimensionally stable second part that each have an end connected to the first hinge, and wherein the first part and the second part are connected via the first hinge such that the first and second parts can pivot with respect to each other and the first and second parts remain substantially straight and dimensionally stable when the first and second parts pivot with respect to each other, and wherein, in use, a part of the flexible transportation line forming said first hinge twists during pivot movement between said first part and said second part to enable said pivot movement.

\* \* \* \* \*